(12) United States Patent
Wang et al.

(10) Patent No.: US 11,106,143 B2
(45) Date of Patent: Aug. 31, 2021

(54) MASK FORK FOR TRANSFERRING MASK, AND CORRESPONDING MASK BOX AND MASK TRANSFERRING METHOD

(71) Applicant: SHANGHAI MICRO ELECTRONICS EQUIPMENT (GROUP) CO., LTD., Shanghai (CN)

(72) Inventors: Gang Wang, Shanghai (CN); Rongjun Zhang, Shanghai (CN); Dongliang Huang, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/637,952

(22) PCT Filed: Jul. 17, 2018

(86) PCT No.: PCT/CN2018/099679
§ 371 (c)(1),
(2) Date: Feb. 10, 2020

(87) PCT Pub. No.: WO2019/029634
PCT Pub. Date: Feb. 14, 2019

(65) Prior Publication Data
US 2020/0201195 A1    Jun. 25, 2020

(30) Foreign Application Priority Data
Aug. 11, 2017 (CN) .......................... 201710686899.0

(51) Int. Cl.
*G03F 7/20* (2006.01)
(52) U.S. Cl.
CPC ............ *G03F 7/70741* (2013.01); *G03F 7/20* (2013.01)

(58) Field of Classification Search
CPC .......... G03F 1/66; G03F 7/20; G03F 7/70741; G03F 7/70733; G03F 7/70758
See application file for complete search history.

(56) References Cited

U.S. PATENT DOCUMENTS

| 10,908,497 B2* | 2/2021 | Wang ........................ G03F 1/66 |
| 2005/0281639 A1 | 12/2005 | Matsumoto |
| 2009/0201475 A1 | 8/2009 | Peckerar et al. |

FOREIGN PATENT DOCUMENTS

| CN | 2534610 Y | 2/2003 |
| CN | 2924591 Y | 7/2007 |

(Continued)

OTHER PUBLICATIONS

Machine translation of CN 2534610 Y, Feb. 5, 2003.*
Machine translation of CN 201402365 Y Feb. 10, 2010.*

*Primary Examiner* — Peter B Kim
(74) *Attorney, Agent, or Firm* — Muncy, Geissler, Olds & Lowe, P.C.

(57) ABSTRACT

A mask fork, configured to transfer a mask from a standard mechanical interface pod. The standard mechanical interface pod includes a plurality of supports having a L-shaped cross section. Each of the plurality of supports includes a connecting section extending horizontally and a supporting section extending vertically, and the connecting section has a bottom to which a limiting section is fixed. The mask fork includes a fork body and two tines connected to the fork body in symmetry with each other. Each of the tines comprises a transfer member configured to support the mask during a transfer of the mask and anti-collision members including a first anti-collision member extending horizontally and a second anti-collision member extending vertically. The first anti-collision member is horizontally attached to a side of the transfer member facing away from the mask.

14 Claims, 8 Drawing Sheets

(56) References Cited

FOREIGN PATENT DOCUMENTS

| | | |
|---|---|---|
| CN | 101526744 A | 9/2009 |
| CN | 201402365 Y | 2/2010 |
| CN | 103057945 A | 4/2013 |
| CN | 103863821 A | 6/2014 |
| CN | 205450558 U | 8/2016 |
| CN | 107870509 A | 4/2018 |
| JP | 2004-179515 A | 6/2004 |
| KR | 10-2002-0083745 A | 11/2002 |
| KR | 10-2008-0019997 A | 3/2008 |
| TW | 525833 U | 3/2003 |

\* cited by examiner

MASK FORK FOR TRANSFERRING MASK, AND CORRESPONDING MASK BOX AND MASK TRANSFERRING METHOD

TECHNICAL FIELD

The present invention pertains to the technical field of photolithographic apparatus and relates to a mask fork for transferring a mask and to a mask box for use with the mask fork and a mask transfer method.

BACKGROUND

Masks for photolithography are very expensive and fragile, and thus require protection against collisions during their use.

Within a photolithography machine, the location where it is most likely for a mask to be damaged from a collision is its transfer path from a mask box to a mask stage, that is to say, from a mask box to a standard mechanical interface (SMIF) pod and from the SMIF pod to a mask stage. During the transfer of a mask, the mask is likely to be damaged 1) in the course that the mask is taken out of or placed into an external mask box by the mask fork and 2) in the course that the mask is taken out of or placed into an internal mask library by the mask fork.

SUMMARY OF THE DISCLOSURE

It is an objective of the present invention to solve the problem of unsafe removal and placement of the mask due to easy occurrence of collisions therein by providing a mask fork for transferring a mask, a mask box for use with the mask fork and a mask transfer method.

To this end, the present invention provides a mask fork, configured to transfer a mask from a standard mechanical interface pod, wherein the standard mechanical interface pod comprises a plurality of supports having an L-shaped cross section, each of the plurality of supports comprises a connecting section extending horizontally and a supporting section extending vertically, and the connecting section has a bottom to which a limiting section is fixed, wherein the mask fork comprises a fork body and two tines connected to the fork body in symmetry with each other, each of the tines comprises a transfer member configured to support the mask during a transfer of the mask and anti-collision members comprising a first anti-collision member extending horizontally and a second anti-collision member extending vertically, the first anti-collision member is horizontally attached to a side of the transfer member facing away from the mask, the first anti-collision member is connected between the transfer member and the second anti-collision member, such that when the mask fork transfers the mask from the standard mechanical interface pod, a vertical distance between the first anti-collision member and a bottom end of the limiting section is smaller than a vertical distance between the mask and a lower surface of the connecting section above the mask.

Preferably, in the mask fork, the second anti-collision member, the first anti-collision member and a wall of the transfer member close to the second anti-collision member together form a groove; when the mask is being taken out of or being placed into the standard mechanical interface pod by the mask fork, the limiting section is received in the groove.

Preferably, in the mask fork, a top end of the second anti-collision member is higher than the bottom end of the limiting section when the mask fork transfers the mask from the standard mechanical interface pod.

Preferably, in the mask fork, a horizontal distance between the transfer member and the supporting section is smaller than a horizontal distance between the mask and the limiting section.

Preferably, in the mask fork, the transfer members are provided thereon with a plurality of supporting pads configured to support the mask.

Preferably, in the mask fork, the fork body is provided with an actuator assembly configured to push the mask placed on the tines, and each of the tines are provided with a limiting block configured to limit a position of the mask.

Preferably, in the mask fork, the actuator assembly comprises a cylinder and an actuator connected to the cylinder.

Preferably, in the mask fork, the fork body is provided thereon with, sequentially along a moving direction of the actuator, a first sensor and a second sensor, which are configured to monitor a presence of the mask as well as a status of the cylinder in such a manner that:

the first sensor is triggered while the second sensor is not triggered when the cylinder is in a retracted status;

the first sensor and the second sensor are both triggered when the cylinder is in an extended status and the mask is present on the tines; and the second sensor is triggered while the first sensor is not triggered when the cylinder is in an extended status and no mask is present on the tines.

Preferably, in the mask fork, the actuator comprises a push beam and two clamps symmetrically disposed at two opposing ends of the push beam; and wherein the clamps abut against two respective corners of the mask when the mask is being pushed.

The present invention further provides a mask box, for use with a mask fork as defined above, the mask box comprising a top plate, side walls, a base plate and a support seat configured to support a mask, wherein each of the side walls is attached with a barrier comprising a connecting part horizontally attached to a corresponding one of the side walls and a limiting part vertically connected at a free end of the connecting part, wherein the corresponding one of the side walls, the connecting part and the limiting part together form an H-shaped structure, such that when the mask fork transfers a mask from the mask box, a vertical distance between the first anti-collision member and a bottom end of the limiting part is smaller than a vertical distance between the mask and a lower surface of the top plate.

Preferably, in the mask box, a top end of the second anti-collision member is higher than the bottom end of the limiting part when the mask fork transfers the mask from the mask box.

Preferably, in the mask box, a horizontal distance between the second anti-collision member and the limiting part is smaller than a horizontal distance between the mask and the limiting part.

Preferably, in the mask box, the mask box is open at one end, through which a mask is able to be taken out or placed in, and provided at a further end with locating blocks configured to limit a position of the mask.

The present invention still provides a method for transferring a mask from a standard mechanical interface pod or a mask box as defined above, by using a mask fork as defined above, wherein the second anti-collision member, the first anti-collision member and a wall of the transfer member close to the second anti-collision member together form a groove, and wherein the method comprises: inserting the tines into the standard mechanical interface pod or the mask box and inserting the limiting sections of the standard mechanical interface pod or the limiting parts of the mask box into the grooves of the tines when the mask is being taken out of or being placed into the standard mechanical interface pod or the mask box by the mask fork, wherein, so as to limit a vertical movement and a horizontal movement of the tines in the standard mechanical interface pod or the mask box when the mask fork transfers the mask.

Preferably, in the method, a placement of the mask into the standard mechanical interface pod or the mask box by the mask fork comprises steps of:

S11, holding the mask by the transfer members of the tines, pushing the mask by the actuator assembly, clamping two ends of the mask through cooperation of the tines with the limiting blocks at front ends of the tines to fix a position of the mask;

S12, inserting the tines, on which the mask is held, into the standard mechanical interface pod or the mask box until a front end of the mask comes into contact with, or is spaced by a first predetermined distance from, a locating block of the standard mechanical interface pod or the locating blocks of the mask box, wherein the limiting sections of the standard mechanical interface pod or the limiting parts of the mask box are configured to be inserted into the grooves of the tines during the placement; and S13, retracting the actuator assembly and moving the tines downwards until the tines are separated from the mask, thus completing the placement.

Preferably, in the method, taking out the mask from the standard mechanical interface pod or the mask box by the mask fork comprises steps of:

S21, inserting the tines into the standard mechanical interface pod or the mask box, such that the two tines are symmetrically disposed on two opposing sides of the mask and the limiting sections of the standard mechanical interface pod or the limiting parts of the mask box are inserted into the respective grooves in the tines;

S22, lifting up the tines after the tines are moved in place until a lower surface of the mask is in contact with the transfer members, and continuing lifting up the tines to separate the mask from the standard mechanical interface pod or the mask box;

S23, extending out the actuator assembly to cooperate with the limiting blocks at front ends of the tines to clamp both ends of the mask to fix a position of the mask, and moving out the tines to accordingly move the mask out of the standard mechanical interface pod or the mask box.

Preferably, in the method, in step S12, inserting the tines, on which the mask is held, into the mask box further comprises: during insertion of the tines on which the mask is held into the mask box, when the front end of the mask is spaced from the locating blocks of the mask box by a second predetermined distance, the actuator assembly is retracted and separated from the mask; and then the tines continue moving forward until the front ends of the mask come into contact with, or is spaced by the first predetermined distance which is greater than the second predetermined distance from, the locating blocks of the mask box.

According to the present invention, a mask fork for transferring a mask, mask box used with the mask fork, and a method for transferring a mask are provided. Compared with the prior art, during the transfer of a mask by the tines, the mask is supported at its two ends on the transfer members, so that after the mask is lifted by the tines, it can be separated from the supporting sections in the SMIF pod or from the support seat in the mask box. During this transfer process, since the distance between the first anti-collision members and the bottom ends of the limiting sections is smaller than that between a top side of the mask and the lower surfaces of the connecting sections, and the distance between the first anti-collision members and the bottom ends of the limit parts is smaller than that between the top side of the mask and the top plate of the mask box, even when the tines are moved in error upward too much, the first anti-collision members will collide with the limiting sections or the limiting parts before a collision of the mask. In this way, the mask can be prevented from a collision with the connecting sections or the top plate of the mask box, and a protection of the mask in vertical direction is achieved. Likewise, since, in the horizontal direction, the distance between the second anti-collision members and the respective limiting parts is smaller than that between the two sides of the mask and the respective limiting parts, and the distance between the transfer members to the respective supporting sections is smaller than that between the two sides of the mask and the respective limiting sections, either of the second anti-collision members will collide with a respective one of the limiting parts before the mask comes into a collision with the limiting part or either of the transfer members will collide with a respective one of the limiting sections before the mask comes into a collision with the limiting section. Once such a collision takes places, the movement can be stopped to avoid a collision of the mask. With the above system and method, a mask can be protected in various directions, which increases the safety in transfer of the mask.

Figure 1:
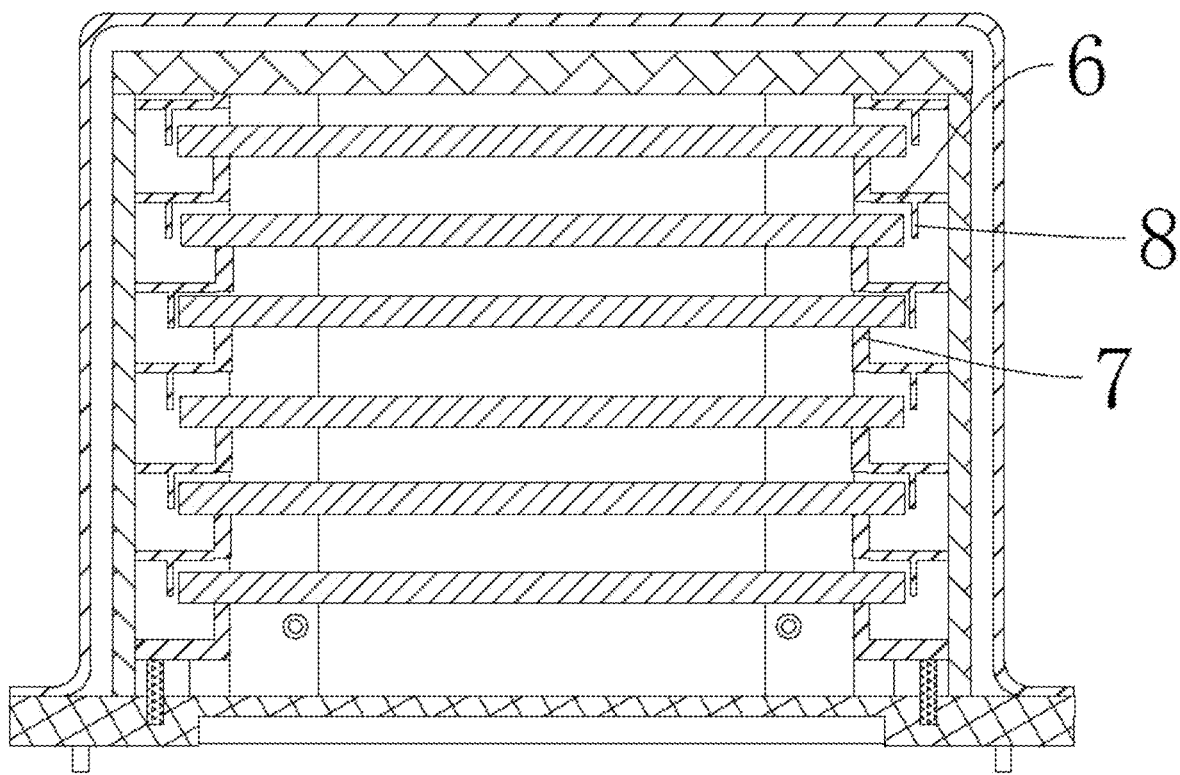
FIG. 1 is a structural schematic of a SMIF pod.

In these figures, 1 denotes a support seat; 2, a side wall; 3, a top plate; 4, a connecting part; 5, a limiting part; 6, a connecting section; 7, a supporting section; 8, a limiting section; 9, a transfer member; 10, a first anti-collision member; 11, a second anti-collision member; 12, a supporting pad; 13, a fork body; 14, a limiting block; 15, a cylinder; 16, an actuator; 17, a first sensor; 18, a second sensor; 19, a first locating block; 20, a second locating block; and 21, a clamp.

DETAILED DESCRIPTION

The mask transfer system and method proposed in the present invention will be described in greater detail below with reference to specific embodiments and to the accompanying drawings. Features and advantages of the invention will become more apparent from the following detailed description, and from the appended claims. Note that the accompanying drawings are provided in a very simplified form not necessarily presented to scale, and their only intention is to facilitate convenience and clarity in explaining the disclosed embodiments. Throughout the figures, the same or similar reference numerals represent the same or similar components.

Figure 2:
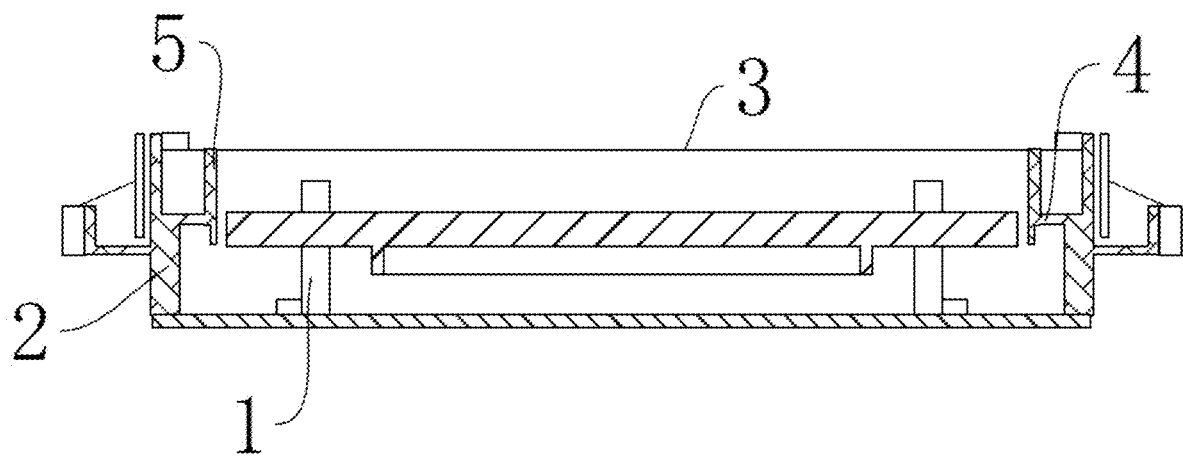
FIG. 2 is a structural schematic of a mask box according to the present invention.
Figure 3:
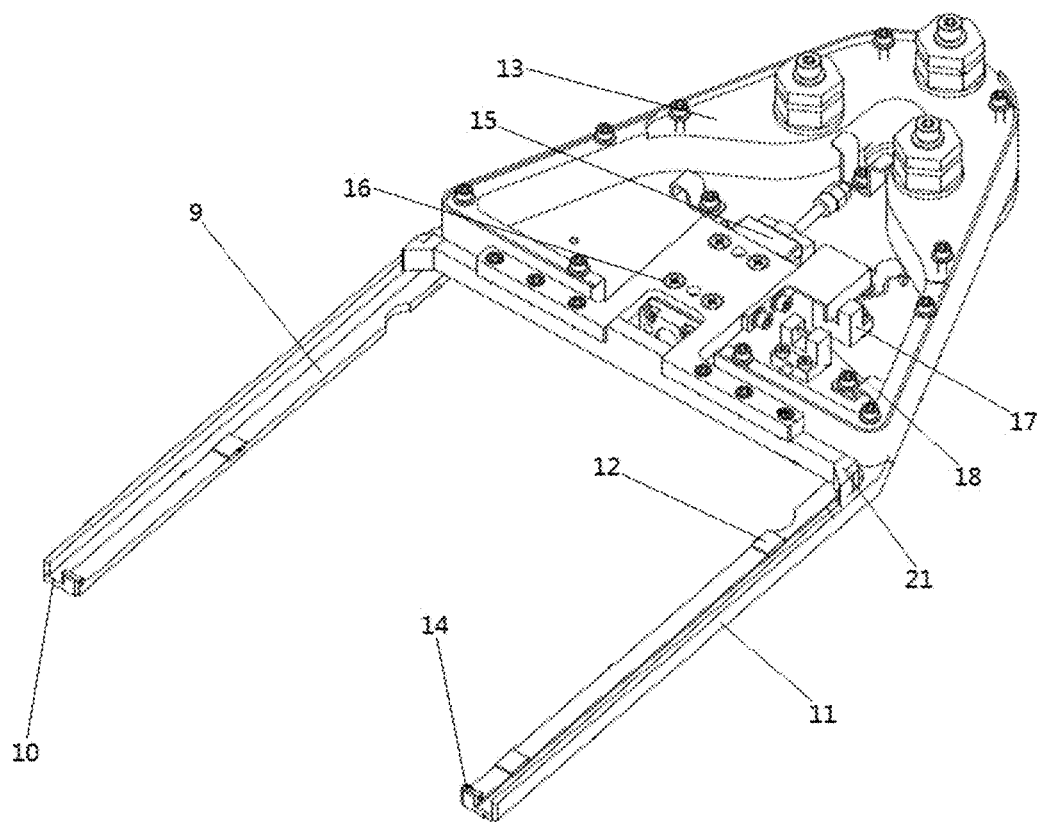
FIG. 3 is a structural schematic of a mask fork according to the present invention.
Figure 4:
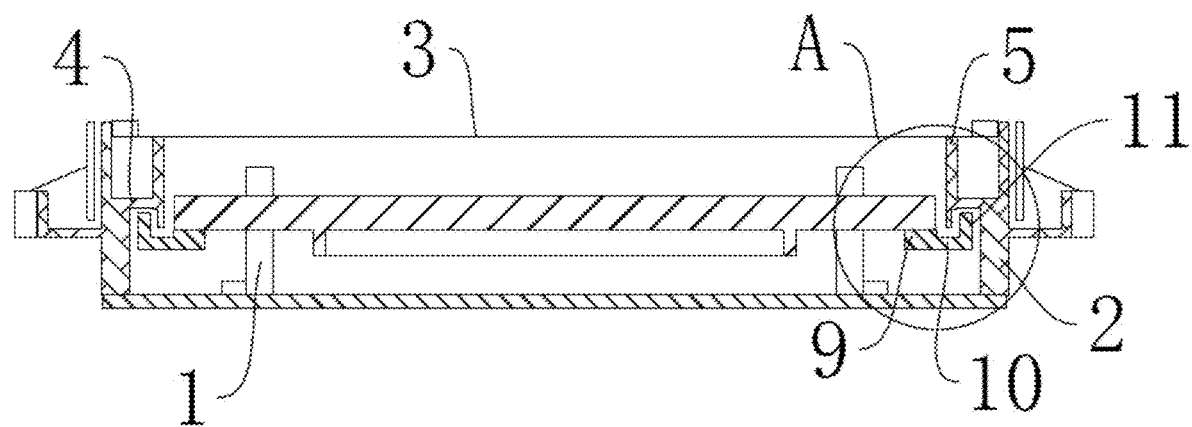
FIG. 4 is a cross-sectional view of a mask box, from or into which a mask can be removed or placed by fork tines, in accordance with the invention.
Figure 5:
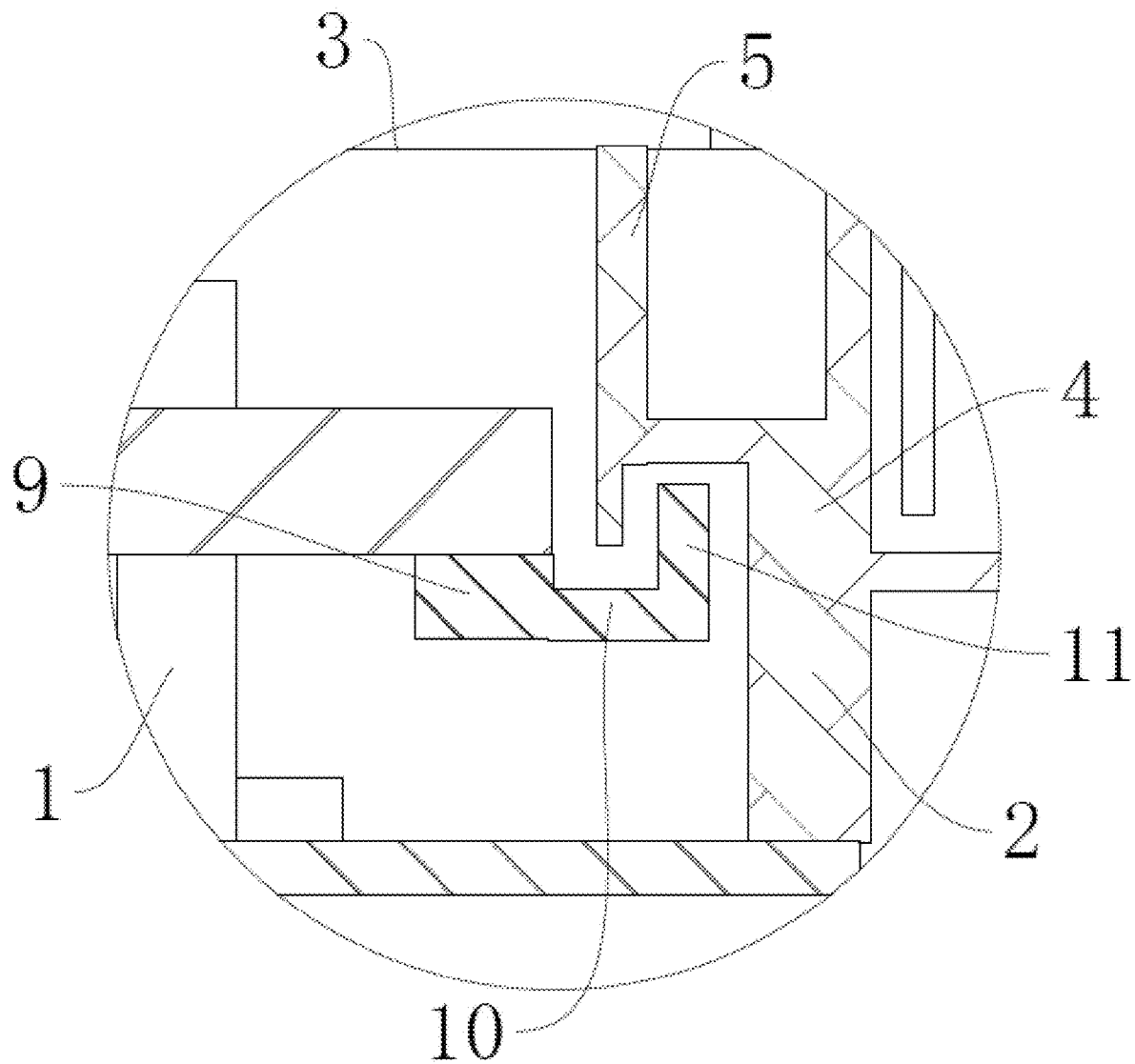
FIG. 5 is an enlarged view of part A of FIG. 4.
Figure 6:
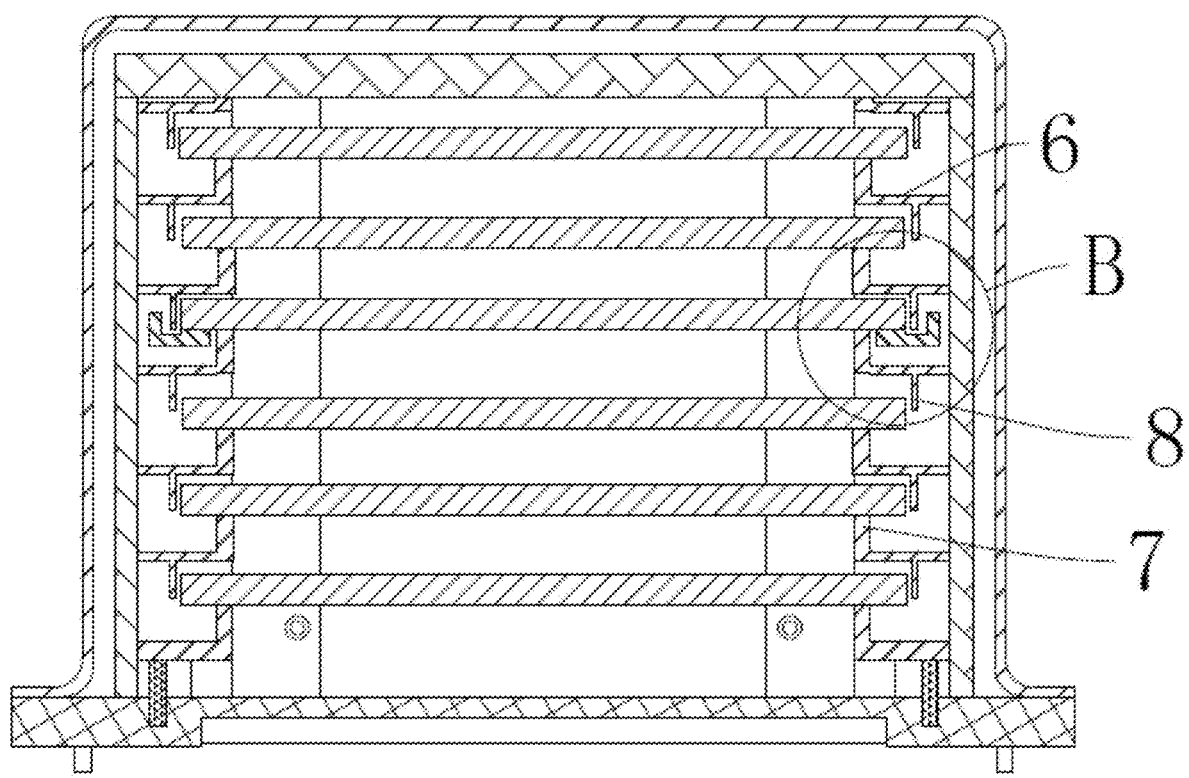
FIG. 6 is a cross-sectional view of a SMIF pod, from or into which masks can be removed or placed by fork tines, in accordance with the invention.
Figure 7:
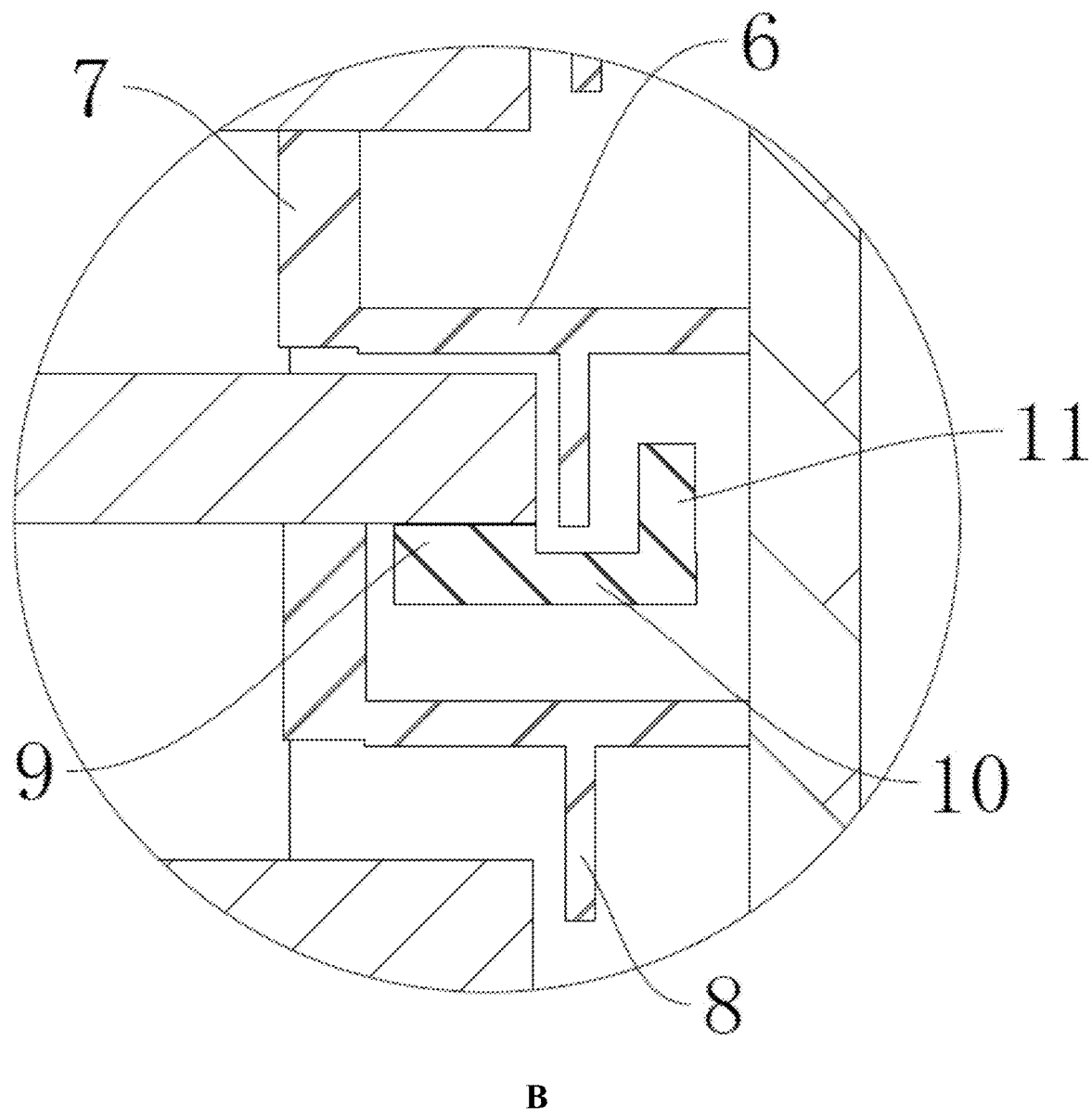
FIG. 7 is an enlarged view of part B of FIG. 6.

In a photolithography apparatus, a mask may be transferred from a mask box to the mask stage by a mask transfer system. Such a mask box, as shown in FIG. 2, may include a support seat 1 configured to support a mask, barriers configured to limit the position of the mask, side walls 2 and a top plate 3, wherein the barriers include connecting parts 4 horizontally attached to the side walls 2 and limiting parts 5 vertically fixed at the free ends of the connecting parts 4 so that each of the limiting parts 5, the respective one of the connecting parts 4 and the respective one of the side walls 2 together form an H-shaped structure. When a mask is situated in the mask box, the support seat 1 will support the mask at the bottom thereof, and a gap is formed between the mask and each of the limiting parts 5. The limiting parts 5 can limit the position of the mask and prevent it from sliding off the support seat 1. In this case, when the mask needs to be taken away by a mask fork, the fork may lift the mask upwards from the support seat 1 and then move it out of the mask box. The mask may be moved from the mask box to a standard mechanic interface (SMIF) pod and then loaded onto a mask stage by the SMIF pod for subsequent processing. SMIF refers to an interface required to ensure that wafers or masks are not exposed, during their handling, in the macro environment of a clean room. A SMIF pod according to the invention includes, as shown in FIG. 1, a plurality layers of supports having an L-shaped cross section. Each of the supports includes a connecting section 6 extending horizontally and a supporting section 7 extending vertically, and the connecting section 6 is provided at the bottom with a limiting section 8 so that when a mask is supported by the supporting sections 7 of a present layer, the mask is also limited by the limiting sections 8 of a layer above the present layer and a height difference is formed between the mask and the connecting sections 6 of the layer above the present layer. When the mask is taken away from the SMIF pod, the mask fork operates in a same way as it does in the mask box.

A mask transfer system includes, as shown in FIGS. 3 to 10, a SMIF pod, a mask box and one or more of the mask forks configured to transfer masks. The SMIF pod includes a plurality layers of supports having a L-shaped cross section. Each of the supports includes a connecting section 6 extending horizontally and a supporting section 7 extending vertically, and the connecting section 6 is provided at the bottom with a limiting section 8. The mask box includes a top plate 3, side walls 2, a base plate and a support seat 1 configured to support a mask.

A barrier is fastened on each of the side walls 2, wherein the barriers includes connecting parts 4 horizontally attached to the side walls 2 and limiting parts 5 vertically fixed at the free ends of the connecting parts 4 so that each of the limiting parts 5, the respective one of the connecting parts 4 and the respective one of the side walls 2 together form an H-shaped structure.

The fork includes a fork body 13 and two tines connected thereto in symmetry with each other. Each of the tines includes a transfer member 9 and anti-collision members including a first anti-collision member 10 extending horizontally and a second anti-collision member 11 extending vertically. When a mask is taken out of or placed into the SMIF pod or the mask box by the mask fork, the mask is supported by the two transfer members 9. The first anti-collision member 10 is horizontally connected to the side of the transfer member 9 facing away from the mask and is connected between the transfer member 9 and the second anti-collision member 11. In addition, the second anti-collision member 11, the first anti-collision member 10 and a wall of the transfer member 9 close to the second anti-collision member 11 together form a groove. When a mask is taken out of or placed into the SMIF pod or the mask box by the mask fork, the limiting section 8 or the limiting part 5 are received in the grooves.

Preferably, when a mask is taken out of or placed into the SMIF pod or the mask box by the mask fork, a vertical distance between the first anti-collision member 10 and a bottom end of the limiting part 5 is smaller than a vertical distance between the mask to a lower surface of the top plate 3, and a vertical distance between the first anti-collision member 10 and a bottom end of the limiting section 8 is smaller than a vertical distance between the mask and a lower surface of the connecting section 6 above the mask.

Preferably, in this embodiment, a top end of the second anti-collision member 11 may be higher than the bottom end of the limiting part 5 or of the limiting section 8.

Further, when a mask is taken out of or placed into the SMIF pod or the mask box by the mask fork, a horizontal distance between the second anti-collision member 11 and the limiting part 5 may be smaller than a horizontal distance between the mask and the limiting part 5, and a horizontal distance between the transfer member 9 and the supporting section 7 may be smaller than a horizontal distance between the mask and the limiting section 8.

Further, the transfer members 9 may be provided thereon with a plurality of supporting pads 12 configured to support the mask. In this way, better mask supporting can be ensured. Preferably, three such supporting pads 12 are provided and arranged into a triangle across the two tines. Optionally, the supporting pads 12 may be made from polyetheretherketone (PEEK).

Further, the fork body 13 may be provided with an actuator assembly configured to push a mask placed on the tines. The tines are provided with limiting blocks 14 configured to limit the position of a mask. The actuator assembly may include a cylinder 15 and an actuator 16 coupled thereto so that they together generally define a shape like the letter T. The actuator 16 may include a push beam and two clamps 21 disposed symmetrically at opposing ends of the push beam. When the mask is pushed, the clamps 21 abut against respective corners of the mask so as to immobilize and locate the mask.

Further, the fork body 13 may be provided thereon with, sequentially along a moving direction of the actuator 16, a first sensor 17 and a second sensor 18, which are configured to monitor the presence of a mask as well as a status of the cylinder 15 in such a manner that the first sensor 17 is triggered while the second sensor 18 is not when the cylinder 15 is in a retracted status, the first and second sensors 17, 18 are both triggered when the cylinder 15 is in an extended status with a mask on the tines, and the second sensor 18 is triggered while the first sensor 17 is not when the cylinder 15 is in an extended status without any mask on the tines. In this way, based on whether the first sensor 17 and/or the second sensor 18 is/are triggered or not, it can be readily determined whether there is a mask on the tines, and an appropriate action may be taken based on this determination.

Figure 10:
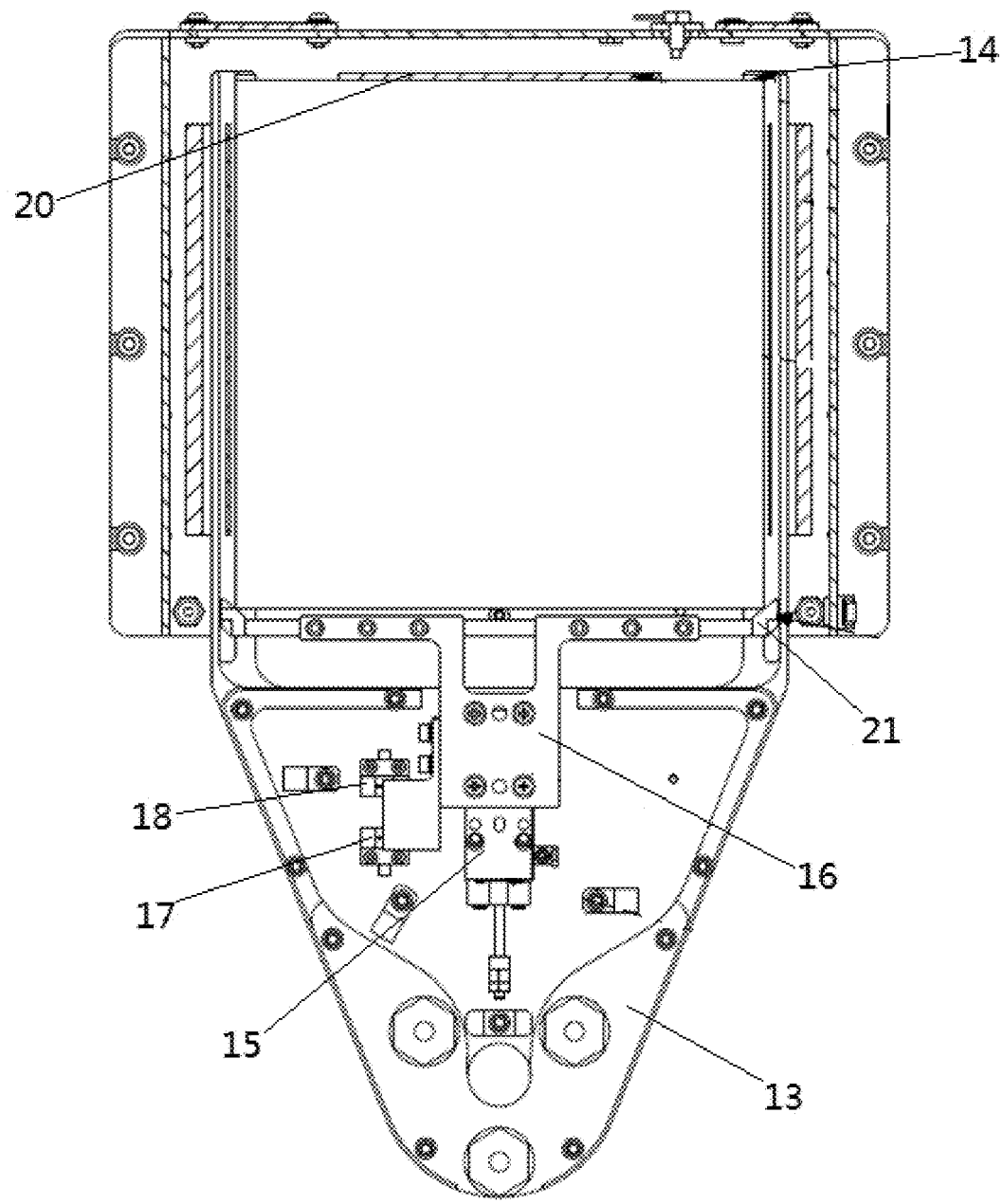
FIG. 10 is a top view of a mask fork that is placing a mask into a SMIF pod, in accordance with the invention.

Further, the mask box may be open at one end, through which a mask can be taken out or placed in, and provided at the other end with first locating blocks 19 configured to limit the position of the mask. Optionally, as shown FIG. 8, the first locating blocks 19 may be implemented as two small locating blocks. The SMIF pod may also be open at one end, through which masks can be taken out or placed in, and provided at the other end with a second locating block 20 configured to limit the positions of the masks. Optionally, the second locating block 20 may be a large locating block with an effective area that is at least larger than half an area spanned by front sides of the masks, as shown in FIG. 10.

A mask transfer method is provided, in which a mask is taken out or placed into the SMIF pod or mask box by using a mask fork as defined above. During operation, the tines of the mask fork is inserted into the SMIF pod or the mask box, and the limiting sections 8 of the SMIF pod or the limiting parts 5 of the mask box is inserted into the grooves of the tines to limit the vertical and horizontal movements of the tines in the SMIF pod and in the mask box when the mask is taken out or place into the SMIF pod or mask box by the tines.

Further, the placement of the mask into the SMIF pod or mask box by the fork may include the steps of:

(S11) holding the mask by the transfer members 9 of the tines, pushing the mask by the actuator assembly on the fork body 13, and clamping both ends of the mask by the actuator assembly together with the limiting blocks 14 at the front ends of the tines to fix the position of the mask;

(S12) inserting the tines, on which the mask is held, into the SMIF pod or mask box until a front end of the mask comes into contact with, or is spaced by a first predetermined distance from, the second locating block 20 of the SMIF pod or the first locating blocks 19 of the mask box and inserting the limiting sections 8 of the SMIF pod or the limiting parts 5 of the mask box into the respective grooves in the tines; and (S13) retracting the actuator assembly and moving the tines downwards until they are separated from the mask, thus completing the placement.

Further, the transfer of the mask out of the SMIF pod or mask box by the fork may include the steps of:

(S21) inserting the tines into the SMIF pod or mask box, wherein the two tines are symmetrically disposed on opposing sides of the mask and the limiting sections 8 of the SMIF pod or the limiting parts 5 of the mask box is inserted into the grooves in the tines;

(S22) lifting up the tines after they are moved in place until the lower surface of the mask is in contact with the transfer members 9, and continuing lifting up the tines to separate the mask from the SMIF pod or the mask box;

(S23) extending out the actuator assembly to cooperate with the limiting blocks 14 at the front ends of the tines to clamp both ends of the mask to fix the position of the mask and moving out the tines to cause an according movement of the mask out of the SMIF pod or mask box.

Figure 8:
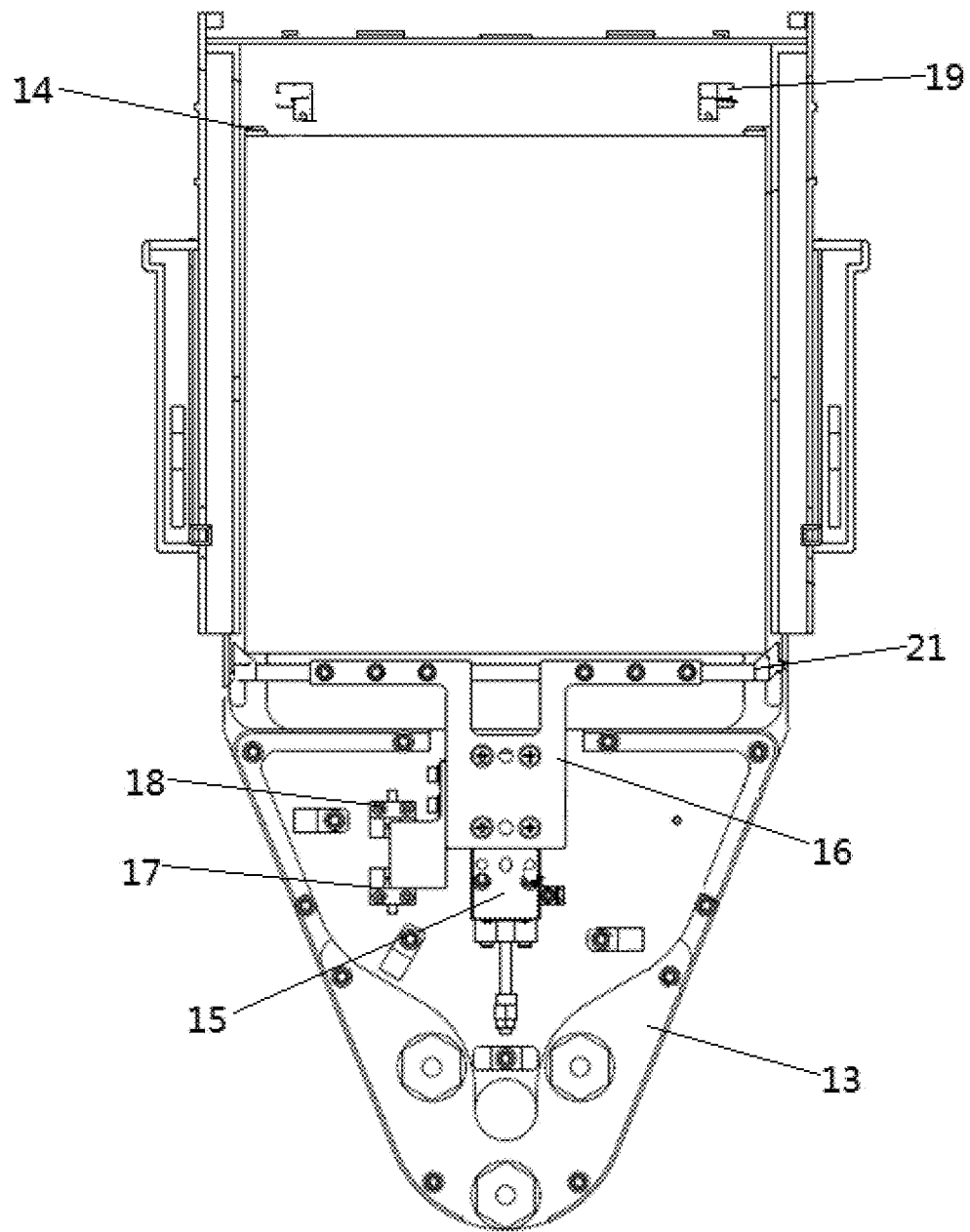
FIG. 8 is a diagram showing the progress of placement of a mask into a mask box by a mask fork, in accordance with the invention.
Figure 9:
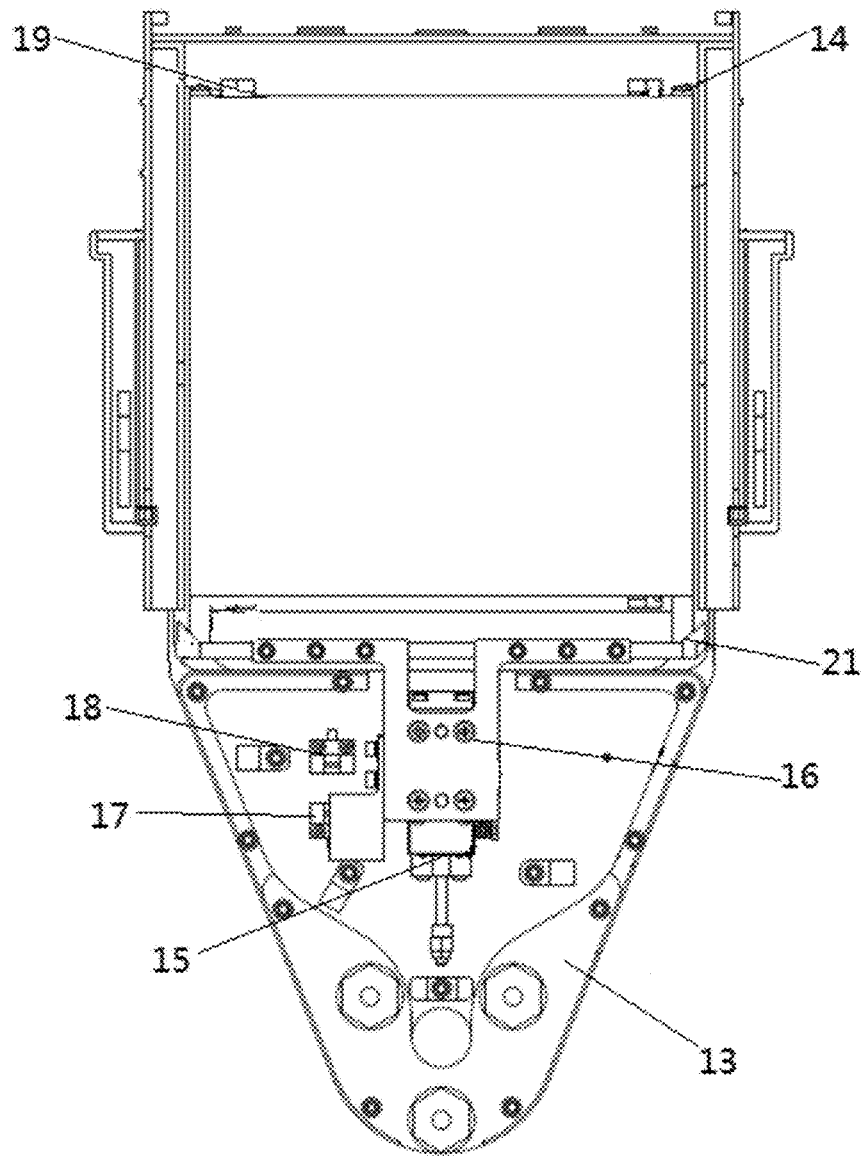
FIG. 9 is diagram showing the progress of placement of the mask into the mask box by the mask fork, in accordance with the invention.

Further, in step S12, inserting the tines, on which the mask is held, into the mask box may include:

During the inserting of the tines on which the mask is held into the mask box, when the front end of the mask is spaced from the first locating blocks 19 of the mask box by a second predetermined distance, the actuator assembly is retracted and separated from the mask, as shown in FIG. 8; and then the tines continue moving forward until the front ends of the mask come into contact with, or is spaced by the first predetermined distance which is greater than the second predetermined distance from, the locating blocks 19 of the mask box, as shown in FIG. 9.

In summary, according to the present invention, a mask fork for transferring a mask, mask box used with the mask fork, and a method for transferring a mask are provided. When a mask is moved out of the mask box firstly, the tines are inserted into the mask box under the drive of the fork body 13, and the two tines are distributed at two sides of the mask. Then, the tines may be moved upward so that the transfer members 9 are brought into contact with a lower surface of the mask and then lifts up the mask. The cylinder 15 may cause the actuator 16 to move and thus to abut and push the mask at one side thereof so that the mask comes into contact, at the other side, with the limiting blocks 14. As a result, the mask is subject to positional limitation at both front and rear ends, which ensures a stable relative position between the mask and the tines. Subsequently, the tines further move to transfer the mask, during which the first anti-collision members 10 would collide with the limiting parts 5 before the collision of the mask with the top plate 3 of the mask box if the tines wobble because, in a vertical direction, the distance between the first anti-collision members 10 and the limiting parts 5 of the mask box is smaller than the distance between the mask and the top plate 3 of the mask box. Therefore, the tines are prevented from further moving upwards, so that the mask can be protected. Likewise, the second anti-collision members 11 would collide with the limiting parts 5 of the mask box before the collision of the mask with the limiting parts 5 of the mask box if the tines wobble to the left and right because, in a horizontal direction, the distance between the second anti-collision members 11 and the limiting parts 5 of the mask box is smaller than the distance between the mask and the limiting parts 5 of the mask box. Therefore, the collision between the masks can be avoided, so that the masks can be protected in the horizontal direction. Similarly, the masks can be protected in the vertical and horizontal directions respectively by the first anti-collision members 10 and the transfer members 9 when being taken out of the SMIF pod. As a result, the protection is more comprehensive and the safety in transfer of the masks is high.

Besides the above, in case of placing a mask into the mask box, the tines may stop moving and the actuator 16 is retracted to separate from the mask when it is spaced from the first locating blocks 19 by the second predetermined distance, followed by further movements of the tines. In this way, even when the mask comes into contact with the first locating blocks 19 during the movement, it still can side on the tines without a large squeezing because the rear ends of the mask are no longer limited by the actuator 16. In case of the SMIF pod, the tines may stop moving forward and the actuator 16 is retracted when the front ends of the mask are spaced from the second locating block 20 by a certain distance. As such, even when an accidental collision occurs, due to a relatively large contact area between the second locating block 20 and the mask as well as a certain buffering effect resulting from the retraction of the cylinder, the mask will not be damaged because of a relatively small acting force between the second locating block 20 and the mask.

Since mask transfer from the mask box to the SMIF pod, or from the SMIF pod to the mask box, can be performed in parallel with an exposure process carried out by the photolithography apparatus, the requirements on the transfer are rather moderate and it is possible to determine a second predetermined distance, so that the mask can be protected sufficiently by the retraction of the cylinder 15 which is performed before the mask reaches the first locating blocks 19. However, as the time taken in transferring a mask from the SMIF pod to a mask stage, or from the mask stage to the SMIF pod, would directly affect the efficiency of the photolithography apparatus, it is generally required to be as short as possible. To this end, the second locating block 20 with a large effective area may be employed to allow quick mask removal or placement. In other words, the first locating blocks 19 and second locating block 20 are used in coordination with the actual needs of the photolithography apparatus in order to achieve optimal results.

The embodiments disclosed herein are described in a progressive manner, with the description of each embodiment focusing on its differences from others. Reference can be made between the embodiments for their identical or similar parts. Since the invented devices employed in the method embodiments have been described in detail previously, they are just briefed in such embodiments, and reference can be made to the previous device embodiments for more details therein.

The description presented above is merely that of a few preferred embodiments of the present invention and does not limit the scope thereof in any sense. Any and all changes and modifications made by those of ordinary skill in the art based on the above teachings fall within the scope as defined in the appended claims.

What is claimed is:

1. A mask fork, configured to transfer a mask from a standard mechanical interface pod, wherein the standard mechanical interface pod comprises, along a vertical direction, a plurality of supports having an L-shaped cross section, each of the plurality of supports comprises a connecting section extending horizontally and a supporting section extending vertically, and the connecting section has a bottom to which a limiting section is fixed, wherein
the mask fork comprises a fork body and two tines connected to the fork body in symmetry with each other, each of the tines comprises a transfer member configured to support the mask during a transfer of the mask and anti-collision members comprising a first anti-collision member extending horizontally and a second anti-collision member extending vertically, the first anti-collision member is horizontally attached to a side of the transfer member facing away from the mask, the first anti-collision member is connected between the transfer member and the second anti-collision member, such that when the mask fork transfers the mask from the standard mechanical interface pod, a vertical distance between the first anti-collision member and a bottom end of the limiting section is smaller than a vertical distance between the mask and a lower surface of the connecting section above the mask;
wherein the fork body is provided with an actuator assembly configured to push the mask placed on the tines, and each of the tines are provided with a limiting block configured to limit a position of the mask; the actuator assembly comprises a cylinder and an actuator connected to the cylinder;
wherein the actuator comprises a push beam and two clamps symmetrically disposed at two opposing ends of the push beam; and wherein the clamps abut against two respective corners of the mask when the mask is being pushed.

2. The mask fork of claim 1, wherein the second anti-collision member, the first anti-collision member and a wall of the transfer member close to the second anti-collision member together form a groove;
when the mask is being taken out of or being placed into the standard mechanical interface pod by the mask fork, the limiting section is received in the groove.

3. The mask fork of claim 1, wherein a top end of the second anti-collision member is higher than the bottom end of the limiting section when the mask fork transfers the mask from the standard mechanical interface pod.

4. The mask fork of claim 1, wherein a horizontal distance between the transfer member and the supporting section is smaller than a horizontal distance between the mask and the limiting section.

5. The mask fork of claim 1, wherein the transfer members are provided thereon with a plurality of supporting pads configured to support the mask.

6. The mask fork of claim 1, wherein the fork body is provided thereon with, sequentially along a moving direction of the actuator, a first sensor and a second sensor, which are configured to monitor a presence of the mask as well as a status of the cylinder in such a manner that:
the first sensor is triggered while the second sensor is not triggered when the cylinder is in a retracted status;
the first sensor and the second sensor are both triggered when the cylinder is in an extended status and the mask is present on the tines; and
the second sensor is triggered while the first sensor is not triggered when the cylinder is in an extended status and no mask is present on the tines.

7. A mask box, for use with a mask fork configured to transfer a mask from a standard mechanical interface pod, wherein the standard mechanical interface pod comprises, along a vertical direction, a plurality of supports having an L-shaped cross section, each of the plurality of supports comprises a connecting section extending horizontally and a supporting section extending vertically, and the connecting section has a bottom to which a limiting section is fixed, wherein
the mask fork comprises a fork body and two tines connected to the fork body in symmetry with each other, each of the tines comprises a transfer member configured to support the mask during a transfer of the mask and anti-collision members comprising a first anti-collision member extending horizontally and a second anti-collision member extending vertically, the first anti-collision member is horizontally attached to a side of the transfer member facing away from the mask, the first anti-collision member is connected between the transfer member and the second anti-collision member, such that when the mask fork transfers the mask from the standard mechanical interface pod, a vertical distance between the first anti-collision member and a bottom end of the limiting section is smaller than a vertical distance between the mask and a lower surface of the connecting section above the mask;
wherein the fork body is provided with an actuator assembly configured to push the mask placed on the tines, and each of the tines are provided with a limiting block configured to limit a position of the mask; the actuator assembly comprises a cylinder and an actuator connected to the cylinder;
wherein the actuator comprises a push beam and two clamps symmetrically disposed at two opposing ends of the push beam; and wherein the clamps abut against two respective corners of the mask when the mask is being pushed;
the mask box comprising a top plate, side walls, a base plate and a support seat configured to support a mask, wherein each of the side walls is attached with a barrier comprising a connecting part horizontally attached to a corresponding one of the side walls and a limiting part vertically connected at a free end of the connecting part, wherein the corresponding one of the side walls, the connecting part and the limiting part together form an H-shaped structure, such that when the mask fork transfers a mask from the mask box, a vertical distance between the first anti-collision member and a bottom end of the limiting part is smaller than a vertical distance between the mask and a lower surface of the top plate.

8. The mask box of claim 7, wherein a top end of the second anti-collision member is higher than the bottom end of the limiting part when the mask fork transfers the mask from the mask box.

9. The mask box of claim 7, wherein a horizontal distance between the second anti-collision member and the limiting part is smaller than a horizontal distance between the mask and the limiting part.

10. The mask box of claim 7, wherein the mask box is open at one end, through which a mask is able to be taken out or placed in, and provided at a further end with locating blocks configured to limit a position of the mask.

11. A method for transferring a mask from a standard mechanical interface pod or a mask box by using a mask fork configured to transfer a mask from a standard mechanical interface pod, wherein the standard mechanical interface pod comprises, along a vertical direction, a plurality of supports having an L-shaped cross section, each of the plurality of supports comprises a connecting section extending horizontally and a supporting section extending vertically, and the connecting section has a bottom to which a limiting section is fixed, wherein the mask fork comprises a fork body and two tines connected to the fork body in symmetry with each other, each of the tines comprises a transfer member configured to support the mask during a transfer of the mask and anti-collision members comprising a first anti-collision member extending horizontally and a second anti-collision member extending vertically, the first anti-collision member is horizontally attached to a side of the transfer member facing away from the mask, the first anti-collision member is connected between the transfer member and the second anti-collision member, such that when the mask fork transfers the mask from the standard mechanical interface pod, a vertical distance between the first anti-collision member and a bottom end of the limiting section is smaller than a vertical distance between the mask and a lower surface of the connecting section above the mask;

wherein the fork body is provided with an actuator assembly configured to push the mask placed on the tines, and each of the tines are provided with a limiting block configured to limit a position of the mask; the actuator assembly comprises a cylinder and an actuator connected to the cylinder;

wherein the actuator comprises a push beam and two clamps symmetrically disposed at two opposing ends of the push beam; and wherein the clamps abut against two respective corners of the mask when the mask is being pushed;

wherein the mask box comprising a top plate, side walls, a base plate and a support seat configured to support a mask, wherein each of the side walls is attached with a barrier comprising a connecting part horizontally attached to a corresponding one of the side walls and a limiting part vertically connected at a free end of the connecting part, wherein the corresponding one of the side walls, the connecting part and the limiting part together form an H-shaped structure, such that when the mask fork transfers a mask from the mask box, a vertical distance between the first anti-collision member and a bottom end of the limiting part is smaller than a vertical distance between the mask and a lower surface of the top plate;

wherein the second anti-collision member, the first anti-collision member and a wall of the transfer member close to the second anti-collision member together form a groove, and wherein the method comprises: inserting the tines into the standard mechanical interface pod or the mask box and inserting the limiting sections of the standard mechanical interface pod or the limiting parts of the mask box into the grooves of the tines when the mask is being taken out of or being placed into the standard mechanical interface pod or the mask box by the mask fork, wherein, so as to limit a vertical movement and a horizontal movement of the tines in the standard mechanical interface pod or the mask box when the mask fork transfers the mask.

12. The method of claim 11, wherein a placement of the mask into the standard mechanical interface pod or the mask box by the mask fork comprises steps of:

S11, holding the mask by the transfer members of the tines, pushing the mask by the actuator assembly, clamping two ends of the mask through cooperation of the tines with the limiting blocks at front ends of the tines to fix a position of the mask;

S12, inserting the tines, on which the mask is held, into the standard mechanical interface pod or the mask box until a front end of the mask comes into contact with, or is spaced by a first predetermined distance from, a locating block of the standard mechanical interface pod or the locating blocks of the mask box, wherein the limiting sections of the standard mechanical interface pod or the limiting parts of the mask box are configured to be inserted into the grooves of the tines during the placement; and S13, retracting the actuator assembly and moving the tines downwards until the tines are separated from the mask, thus completing the placement.

13. The method of claim 12, wherein in step S12, inserting the tines, on which the mask is held, into the mask box further comprises:

during insertion of the tines on which the mask is held into the mask box, when the front end of the mask is spaced from the locating blocks of the mask box by a second predetermined distance, the actuator assembly is retracted and separated from the mask; and then the tines continue moving forward until the front ends of the mask come into contact with, or is spaced by the first predetermined distance which is greater than the second predetermined distance from, the locating blocks of the mask box.

14. The method of claim 11, wherein taking out the mask from the standard mechanical interface pod or the mask box by the mask fork comprises steps of:

S21, inserting the tines into the standard mechanical interface pod or the mask box, such that the two tines are symmetrically disposed on two opposing sides of the mask and the limiting sections of the standard mechanical interface pod or the limiting parts of the mask box are inserted into the respective grooves in the tines;

S22, lifting up the tines after the tines are moved in place until a lower surface of the mask is in contact with the transfer members, and continuing lifting up the tines to separate the mask from the standard mechanical interface pod or the mask box; and S23, extending out the actuator assembly to cooperate with the limiting blocks at front ends of the tines to clamp both ends of the mask to fix a position of the mask, and moving out the tines to accordingly move the mask out of the standard mechanical interface pod or the mask box.

\* \* \* \* \*